(12) United States Patent
Zhang (10) Patent No.: US 11,636,815 B2
(45) Date of Patent: Apr. 25, 2023

(54) METHOD FOR CONTROLLING TIMING CONTROLLER CHIP OF DISPLAY PANEL, AND DISPLAY PANEL

(71) Applicant: HKC CORPORATION LIMITED, Shenzhen (CN)

(72) Inventor: Liang Zhang, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 365 days.

(21) Appl. No.: 17/040,971

(22) PCT Filed: Jan. 29, 2019

(86) PCT No.: PCT/CN2019/073607
§ 371 (c)(1),
(2) Date: Sep. 23, 2020

(87) PCT Pub. No.: WO2020/133630
PCT Pub. Date: Jul. 2, 2020

(65) Prior Publication Data
US 2021/0210029 A1    Jul. 8, 2021

(30) Foreign Application Priority Data
Dec. 27, 2018  (CN) .......................... 201811607004.0

(51) Int. Cl.
*G09G 3/36*        (2006.01)
*G11C 7/22*        (2006.01)

(52) U.S. Cl.
CPC ................ *G09G 3/36* (2013.01); *G11C 7/22* (2013.01); *G09G 2310/08* (2013.01); *G09G 2330/02* (2013.01); *G09G 2360/12* (2013.01)

(58) Field of Classification Search
CPC .. G09G 3/36; G09G 2310/08; G09G 2330/02; G09G 2360/12; G11C 7/22
See application file for complete search history.

(56) References Cited

U.S. PATENT DOCUMENTS

2008/0204464 A1    8/2008  Roh
2019/0066632 A1*   2/2019  Wang ..................... G09G 5/393

FOREIGN PATENT DOCUMENTS

| CN | 101996144 A |   | 3/2011  |              |
|----|-------------|---|---------|--------------|
| CN | 202486769 U |   | 10/2012 |              |
| CN | 107526979   | * | 8/2017  | ............. G06F 21/84 |
| CN | 107526979 A |   | 12/2017 |              |
| KR | 20150071288 | * | 12/2013 | ......... G02F 1/13306 |
| KR | 20170068812 A |  | 6/2017 |              |

OTHER PUBLICATIONS

Peian Sun, the ISA written comments, dated Sep. 2019, CN.
Peian Sun, the International Search Report, dated Sep. 2019, CN.

* cited by examiner

*Primary Examiner* — Ifedayo B Iluyomade (57) ABSTRACT

This application discloses a method for controlling a timing controller chip of a display panel and the display panel. The method includes steps of: outputting a write protection level to a write protection pin; detecting an actual level value of the write protection pin; and controlling whether to read an initialization configuration code according to a comparison result of the actual level value with the write protection level.

16 Claims, 2 Drawing Sheets

METHOD FOR CONTROLLING TIMING CONTROLLER CHIP OF DISPLAY PANEL, AND DISPLAY PANEL

CROSS REFERENCE OF RELATED APPLICATIONS

This application claims the priority to the Chinese Patent Application No. CN201811607004.0, filed with National Intellectual Property Administration, PRC on Dec. 27, 2018 and entitled "METHOD FOR CONTROLLING TIMING CONTROLLER CHIP OF DISPLAY PANEL, AND DISPLAY PANEL", which is incorporated herein by reference in its entirety.

TECHNICAL FIELD

This application relates to the field of display devices, particularly to a method for controlling a timing controller chip of a display panel, and the display panel.

BACKGROUND

The description herein provides only background information related to this application, but does not necessarily constitute the existing technology.

With the development and advancement of technology, liquid crystal displays have become mainstream products of displays because of the advantages of thin body, low power consumption, low radiation and the like, and have been widely used. Most of the liquid crystal displays on the market today are backlight type liquid crystal displays, each including a liquid crystal panel and a backlight module. The working principle of the liquid crystal panel is to place liquid crystal molecules in two parallel glass substrates, and apply a driving voltage to the two glass substrates to control the rotation direction of the liquid crystal molecules, so as to refract the light of the backlight module to generate pictures.

The thin film transistor-liquid crystal displays (TFT-LCD) gradually dominates in the display field because of low power dissipation, good image quality, high production yield, and other properties. Similarly, The TFT-LCD includes a liquid crystal panel and a backlight module. The liquid crystal panel includes a color filter substrate (CF Substrate), a thin film transistor substrate (TFT Substrate) and a mask. A transparency electrode is arranged on opposite inner sides of the foregoing substrates. A layer of liquid crystal (LC) molecules are clamped between the two substrates.

Generally, there is internal resistance loss in a circuit of the liquid crystal panel, which may cause the voltage to be unstable, thereby affecting the output of signals, resulting in abnormal pictures, and reducing the experiment and production efficiency.

SUMMARY

The objective of this application is to provide a method for controlling a timing controller chip of a display panel and the display panel, which prevent the screen abnormality caused by initialization configuration code reading error of the timing controller chip.

To achieve the above objective, this application provides a method for controlling a timing controller chip of a display panel, comprising steps of: generating a write protection level and outputting the same to a write protection pin of a memory chip by a pulse modulator; detecting an actual level value of the write protection pin by a detection circuit; comparing the actual level value with the write protection level, and sending a comparison result to the timing controller chip by the detection circuit; and controlling whether to read an initialization configuration code stored in the memory chip according to the comparison result by the timing controller chip.

This application further provides a method for controlling a timing controller chip of a display panel, comprising steps of: generating a write protection level and outputting the same to a write protection pin of a memory chip by a pulse modulator; detecting an actual level value of the write protection pin by a detection circuit; comparing the actual level value with the write protection level, and sending a comparison result to the timing controller chip by the detection circuit; outputting a corresponding enable signal to the timing controller chip according to the comparison result by the detection circuit; if the comparison result is that the actual level value is not equal to the write protection level, sending a first enable signal to the timing controller chip by the detection circuit; controlling to disconnect an inter-integrated circuit bus arranged between the timing controller chip and the memory chip according to the first enable signal by the timing controller chip; skipping outputting an inter-integrated circuit signal to the memory chip by the timing controller chip; restarting a circuit; re-detecting the actual level value of the write protection pin by the detection circuit; if the comparison result is that the actual level value is equal to the write protection level, sending a second enable signal to the timing controller chip by the detection circuit; controlling to enable the inter-integrated circuit bus arranged between the timing controller chip and the memory chip according to the second enable signal by the timing controller chip; outputting an inter-integrated circuit signal to the memory chip, and reading an initialization configuration code stored in the memory chip by the timing controller chip; and performing initialization configuration according to the read initialization configuration code by the timing controller chip.

This application also provides a display panel, comprising: a memory chip, comprising a write protection pin, and storing an initialization code of a timing controller chip; the timing controller chip, reading the initialization code of the timing controller chip and performing initialization configuration; an inter-integrated circuit bus, arranged between the memory chip and the timing controller chip; a pulse modulator, outputting a write protection level to the write protection pin; and a detection circuit, arranged in the pulse modulator, and configured to detect an actual level value of the write protection pin, compare the actual level value with the write protection level, and output a corresponding enable signal to the timing controller chip according to a comparison result; and the timing controller chip includes a Microprogrammed Control Unit, and the Microprogrammed Control Unit receives the corresponding enable signal, and controls to disconnect or enable the inter-integrated circuit bus arranged between the memory chip and the timing controller chip according to the enable signal.

At the time of power-on, the Microprogrammed Control Unit in the timing controller chip reads the initialization configuration code stored in the memory chip through the inter-integrated circuit bus to complete the initialization setting of the timing controller chip. The write protection level actually changes due to interference and the like. When the initialization configuration code is read at the time of level change, the error rate is high, causing subsequent problems. The detection circuit can detect the actual level value of the write protection pin. If the level value is abnormal, it indicates that an error may occur in a reading, and the timing controller chip can be informed not to read, thereby avoiding the reading error.

BRIEF DESCRIPTION OF DRAWINGS

The accompanying drawings included are used for helping understand the embodiments of this application, constitute a part of this specification, illustrate examples of the embodiments of this application and, together with the description, serve to explain the principles of this application. Apparently, the accompanying drawings in the following description merely show some embodiments of this application, and persons of ordinary skill in the art may still derive other drawings from these accompanying drawings without creative effort. In the figures.

DETAILED DESCRIPTION

Specific structures and functional details disclosed herein are merely representative, and are intended to describe the objectives of the exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse", "on", "below", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly include one or more of said features. In the description of this application, unless otherwise stated, "a plurality of" means two or more than two. In addition, the terms "include", "comprise" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in this application according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" when used in this specification, specify the presence of stated features, integers, steps, operations, elements, and/or components, but do not preclude the presence or addition of one or more other features, integers, steps, operations, elements, components, and/or combinations thereof.

This application is further described below with reference to the accompanying drawings and embodiments.

On a drive control panel of a liquid crystal panel, there is an electrically erasable programmable read-only memory IC (EEPROM) configured to store a software code setting of a timing controller chip (TCON). However, the reading error of a TCON code stored in the EEPROM often occurs in actual experiments or production processes, which causes abnormal pictures and reduces the experiment and production efficiency.

Figure 1:
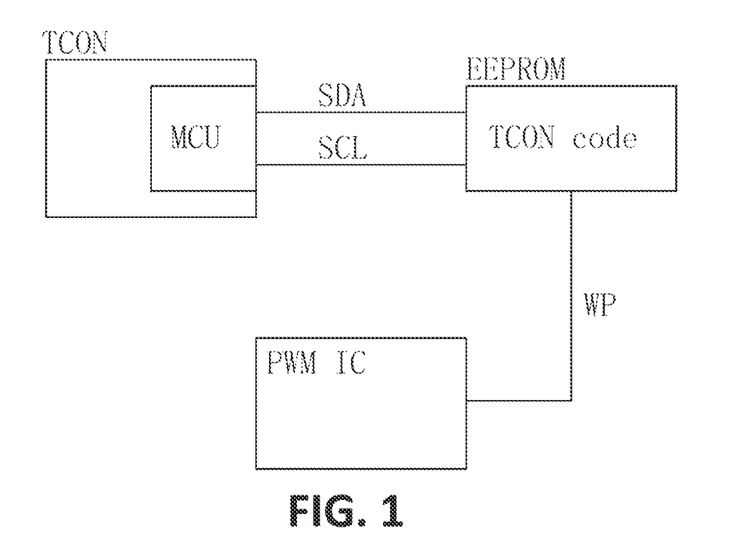
FIG. 1 is a schematic diagram of a communication architecture according to an embodiment of this application.

FIG. 1 shows a communication architecture diagram of TCON and EEPROM. At the time of power-on, the Microprogrammed Control Unit in the TCON is connected to a Microprogrammed Control Unit device and peripheral equipment thereof through an inter-integrated circuit-integrated circuit (I2C) bus. The bus of one serial data line SDA and one serial clock line SCL reads the initialization configuration code stored in the EEPROM to complete the initialization setting of the TCON. WP is an EEPROM write protection signal generated by a PWM IC. Normally, the pull-down High is 3.3V, that is, the WP is normally in a write protection state. However, the problem that more likely occurs now is, due to possible wires or other interference during the experiment and production process, the WP having a level less than 3.3 V fails, and the communication of the I2C bus is abnormal, which may cause a malfunction, resulting in an error when the code stored in the EEPROM is read. Now there is no error correction mechanism, so such a situation may not be prevented.

As shown in FIG. 1 to FIG. 4, an embodiment of this application discloses a method for controlling a timing controller chip 120 of a display panel 100, including steps of:

S11: A pulse modulator 130 generates a write protection level and outputs the same to a write protection pin 112 of a memory chip 110;

S12: A detection circuit 131 detects an actual level value of the write protection pin 112;

S13: The detection circuit 131 compares the actual level value with the write protection level, and sends a comparison result to the timing controller chip 120; and S14: The timing controller chip 120 controls whether to read an initialization configuration code stored in the memory chip 110 according to the comparison result.

The write protection level actually changes due to interference and the like. When the initialization configuration code is read at the time of level change, the error rate is high, causing subsequent problems. The detection circuit 131 can detect the actual level value of the write protection pin 112. If the level value is abnormal, it indicates that an error may occur in a reading, and the timing controller chip 120 can be informed not to read, thereby avoiding the reading error and ensuring normal picture display.

In one embodiment, the step that the timing controller chip 120 controls whether to read an initialization configuration code stored in the memory chip 110 according to the comparison result includes: the detection circuit 131 outputs a corresponding enable signal to the timing controller chip 120 according to the comparison result; and the timing controller chip 120 controls whether to read an initialization configuration code stored in the memory chip 110 according to the corresponding enable signal.

The write protection level is compared with the detected actual level value at the detection circuit 131. The timing controller chip 120 completes such comparison, and controls whether to read according to the enable signal read and used by itself. If an abnormality exists, the timing controller chip 120 will not read the error code that causes the picture display problem.

In one embodiment, the step that the timing controller chip 120 controls whether to read an initialization configuration code stored in the memory chip 110 according to the corresponding enable signal includes: if the comparison result is that the actual level value is not equal to the write protection level, the detection circuit 131 sends a first enable signal to the timing controller chip 120; the timing controller chip 120 controls to disconnect an inter-integrated circuit bus 140 arranged between the timing controller chip 120 and the memory chip 110 according to the first enable signal; and the timing controller chip 120 skips outputting an inter-integrated circuit signal to the memory chip 110.

The first enable signal indicates that the code reading causes unpredictable problems, which may be static interference, other signal interference and other possibilities. At this time, the first enable signal informs the timing controller chip 120 of disconnecting the I2C bus. Since the timing controller chip 120 does not output an I2C signal, the code in the memory chip 110 will not be read, and the timing controller chip 120 will not read the error code that causes the picture display problem.

In one embodiment, after the step that the timing controller chip 120 skips outputting an inter-integrated circuit signal to the memory chip 110, the method further includes the steps that: restart a circuit; the detection circuit 131 re-detects the actual level value of the write protection pin 112; if the comparison result is that the actual level value is equal to the write protection level, the detection circuit 131 sends a second enable signal to the timing controller chip 120; the timing controller chip 120 controls to enable the inter-integrated circuit bus 140 arranged between the timing controller chip 120 and the memory chip 110 according to the second enable signal; the timing controller chip 120 outputs an inter-integrated circuit signal to the memory chip 110, and reads an initialization configuration code stored in the memory chip 110; and the timing controller chip 120 performs initialization configuration according to the read initialization configuration code.

The second enable signal, in addition to controlling to disconnect the I2C bus, also informs the timing controller chip 120 of eliminating static electricity or external signal interference and other problems by restarting the circuit or re-powering or the like. After the problems are eliminated, as long as the WP level returns to normal, the TCON still reads the code correctly, thereby displaying pictures correctly.

As another embodiment of this application, as shown in FIG. 1 to FIG. 4, the embodiment of this application discloses a method for controlling a timing controller chip 120 of a display panel 100, including the steps:

S11: A pulse modulator 130 generates a write protection level and outputs the same to a write protection pin 112 of a memory chip 110;

S12: A detection circuit 131 detects an actual level value of the write protection pin 112;

S13: The detection circuit 131 compares the actual level value with the write protection level, and sends a comparison result to the timing controller chip 120; and S14: The timing controller chip 120 controls whether to read an initialization configuration code stored in the memory chip 110 according to the comparison result.

The write protection level actually changes due to interference and the like. When the initialization configuration code is read at the time of level change, the error rate is high, causing subsequent problems. The detection circuit 131 can detect the actual level value of the write protection pin 112. If the level value is abnormal, it indicates that an error may occur in the reading, and the timing controller chip 120 can be informed not to read, thereby avoiding the reading error and ensuring normal picture display.

In one embodiment, the step that the timing controller chip 120 controls whether to read an initialization configuration code stored in the memory chip 110 according to the comparison result includes: the detection circuit 131 outputs a corresponding enable signal to the timing controller chip 120 according to the comparison result; and the timing controller chip 120 controls whether to read an initialization configuration code stored in the memory chip 110 according to the corresponding enable signal.

The write protection level is compared with the detected actual level value at the detection circuit 131. The timing controller chip 120 completes such comparison, and controls whether to read according to the enable signal read and used by itself. If an abnormality exists, the timing controller chip 120 will not read the error code that causes the picture display problem.

In one embodiment, the step that the timing controller chip 120 controls whether to read an initialization configuration code stored in the memory chip 110 according to the corresponding enable signal includes: if the comparison result is that the actual level value is not equal to the write protection level, the detection circuit 131 sends a first enable signal to the timing controller chip 120; the timing controller chip 120 controls to disconnect an inter-integrated circuit bus 140 arranged between the timing controller chip 120 and the memory chip 110 according to the first enable signal; and the timing controller chip 120 skips outputting an inter-integrated circuit signal to the memory chip 110.

The first enable signal indicates that the code reading causes unpredictable problems, which may be static interference, other signal interference and other possibilities. At this time, the first enable signal informs the timing controller chip 120 of disconnecting the I2C bus. Since the timing controller chip 120 does not output an I2C signal, the code in the memory chip 110 will not be read, and the timing controller chip 120 will not read the error code that causes the picture display problem.

In one embodiment, the step of, if the comparison result is that the actual level value is not equal to the write protection level, the detection circuit 131 sends a first enable signal to the timing controller chip 120, includes:

the pulse modulator 130 sets a preset level value; and if the actual level value is not equal to the write protection level value and equal to the preset level value in the comparison result, the detection circuit 131 sends a third enable signal to the timing controller chip 120.

The output of the preset level value is controlled by a pulse modulation IC. When the preset level value occurs, it indicates that the operation of reading the code has some expected problem, and the code can be mad after the problem is eliminated in a targeted manner. The third enable signal herein is to detect whether the code itself is correct. At this time, the circuit may not be affected by static electricity or interference signals, and the reading operation itself is correct, but may still cause problems such as abnormal picture display. The third enable signal, in addition to informing the timing controller of not reading, also informs it that the code itself is wrong, and a correct code needs to be stored for the memory chip 110 to ensure subsequent normal picture display. After the correct code is stored, the timing controller chip 120 can read the correct code.

In one embodiment, the step that if the actual level value is not equal to the write protection level value and equal to the preset level value in the comparison result, the detection circuit 131 sends a third enable signal to the timing controller chip 120 includes: a detector Ill reads actual checksum information from the actually stored initialization configuration code, compares the actual checksum information with the pre-stored standard checksum information, and outputs an initialization configuration code error signal to the pulse modulator 130 if the actual checksum information is inconsistent with the standard checksum information; the pulse modulator 130 controls the level value of the write protection pin to become the preset level value; and the detection circuit 131 sends a third enable signal to the timing controller chip 120 when detecting the preset level value.

The preset level value represents an error of code data itself. Specifically, the detector 111 may be added to the memory chip 110, and the detector 111 stores the standard checksum information corresponding to the correct code. Before the code is read, the detector Ill detects the actual checksum information in the code, and compares the same with the standard checksum information. If the comparison result is that the both are inconsistent, a code error signal is output to the PWM IC. The IC controls the level value of the write protection pin 112 to become the preset level value, and the detection circuit outputs a third enable signal when detecting the preset level value. The third enable signal not only helps the timing controller chip 120 disconnect the I2C bus, but also informs the reason of disconnection that the code data itself is wrong and needs to be updated to correct code data, such that the timing controller chip 120 can read the normal code and display the same normally.

In one embodiment, the step that the timing controller chip 120 controls whether to read an initialization configuration code of the timing controller chip 120 stored in the memory chip 110 according to the comparison result includes: the detector 111 reads actual checksum information from the actually stored initialization configuration code, and compares the actual checksum information with the pre-stored standard checksum information; and outputs correct information or error information of the initialization configuration code to the timing controller chip 120 according to the comparison result; the timing controller chip 120 controls to disconnect or enable the inter-integrated circuit bus 140 according to the correct information or the error information of the initialization configuration code; and when the timing controller chip 120 receives the correct information of the initialization configuration code, the timing controller chip 120 controls whether to read an initialization configuration code of the timing controller chip 120 stored in the memory chip 110 according to the comparison result of the detection circuit 131.

The detector 111 is added here. The detector 111 reads the actual checksum information from the actually stored code, and compares the actual checksum information with the pre-stored standard checksum information. If the actual checksum information is inconsistent with the standard checksum information, a code error signal is output to the timing controller chip 120. If the actual checksum information is consistent with the standard checksum information, a code correct signal is output to the timing controller chip 120. The timing controller chip 120 first judges whether the code error information or the code correct information is read. If the timing controller chip 120 receives the code error information, the timing controller chip 120 controls to disconnect the I2C bus arranged between the timing controller chip 120 and the memory chip 110.

If the timing controller chip 120 receives the code correct information, the timing controller chip 120 controls whether to read an initialization configuration code of the timing controller chip 120 stored in the memory chip 110 according to the comparison result of the detection circuit 131, and the code correct or error information is directly sent to the timing controller chip 120.

As another embodiment of this application, as shown in FIG. 1 to FIG. 4, the embodiment of this application discloses a method for controlling a timing controller chip 120 of a display panel 100, including steps of:

a pulse modulator 130 generates a write protection level and outputting the same to a write protection pin 112 of a memory chip 110; a detection circuit 131 detects an actual level value of the write protection pin 112; the detection circuit 131 compares the actual level value with the write protection level, and sends a comparison result to the timing controller chip 120; the detection circuit 131 outputs a corresponding enable signal to the timing controller chip 120 according to the comparison result; if the comparison result is that the actual level value is not equal to the write protection level, the detection circuit 131 sends a first enable signal to the timing controller chip 120; the timing controller chip 120 controls to disconnect an inter-integrated circuit bus 140 arranged between the timing controller chip 120 and the memory chip 110 according to the first enable signal; the timing controller chip 120 skips outputting an inter-integrated circuit signal to the memory chip 110; restart a circuit; the detection circuit 131 re-detects the actual level value of the write protection pin 112; if the comparison result is that the actual level value is equal to the write protection level, the detection circuit 131 sends a second enable signal to the timing controller chip 120; the timing controller chip 120 controls to enable the inter-integrated circuit bus 140 arranged between the timing controller chip 120 and the memory chip 110 according to the second enable signal; the timing controller chip 120 outputs an inter-integrated circuit signal to the memory chip 110, and reads an initialization configuration code stored in the memory chip 110; and the timing controller chip 120 performs initialization configuration according to the read initialization configuration code.

The write protection level usually changes due to interference and the like. When the code is read at the time of level change, the error rate is high, causing other subsequent problems. The detection circuit 131 is arranged and can detect the actual level value of the write protection pin 112. The detection circuit 131 outputs a corresponding enable signal to the timing controller chip 120 according to the comparison result. When the comparison result is that the actual level value is not equal to the write protection level, the detection circuit 131 sends a first enable signal to the timing controller chip 120. The first enable signal indicates that the code reading causes unpredictable problems, which may be static interference, other signal interference and other possibilities. At this time, the first enable signal informs the timing controller chip 120 of disconnecting the I2C bus. Since the timing controller chip 120 does not output an I2C signal, the code in the memory chip 110 will not be read, and the timing controller chip 120 will not read the error code that causes the picture display problem. If the comparison result is that the actual level value is equal to the write protection level, the detection circuit 131 sends a second enable signal to the timing controller chip 120. The second enable signal, in addition to controlling to disconnect the I2C bus, also informs the timing controller chip 120 of eliminating static electricity or external signal interference and other problems by restarting a circuit or re-powering or the like. After the problems are eliminated, as long as the WP level returns to normal, the TCON still can read the code correctly, thereby displaying pictures correctly.

As another embodiment of this application, as shown in FIG. 1 to FIG. 4, this application further provides a display panel, including: a memory chip 110, including a write protection pin 112, and storing an initialization code of the timing controller chip 120; the timing controller chip 120, reading the initialization code of the timing controller chip 120 and performing initialization configuration; an inter-integrated circuit bus 140, arranged between the memory chip 110 and the timing controller chip 120; a pulse modulator 130, outputting a write protection level to the write protection pin; and a detection circuit 131, arranged in the pulse modulator 130, and configured to detect the actual level value of the write protection pin 112, compare the actual level value with the write protection level, and output a corresponding enable signal to the timing controller chip 120 according to a comparison result; and the timing controller chip 120 includes a Microprogrammed Control Unit 121, and the Microprogrammed Control Unit 121 receives the corresponding enable signal, and controls to disconnect or enable the inter-integrated circuit bus 140 arranged between the memory chip 110 and the timing controller chip 120 according to the enable signal.

Figure 2:
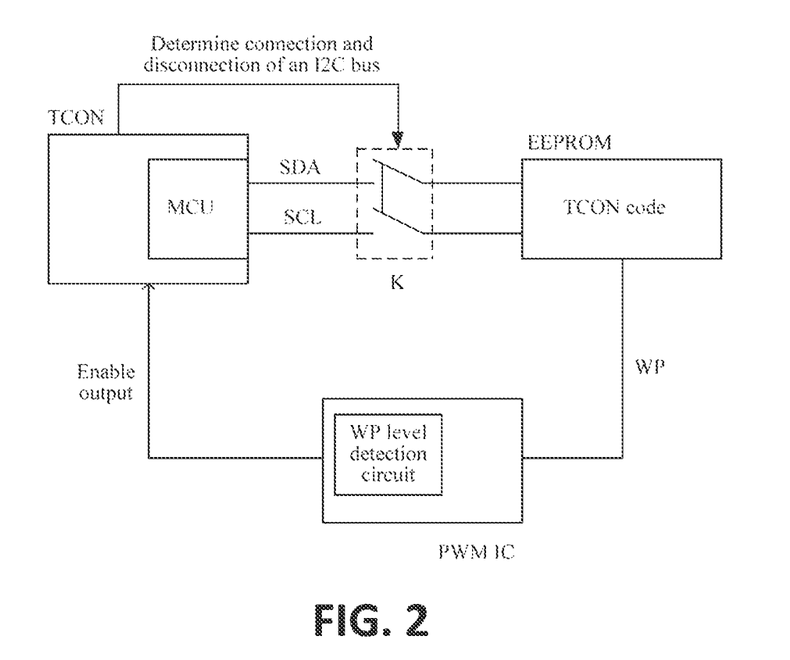
FIG. 2 is a schematic diagram of an improved communication architecture according to an embodiment of this application.
Figure 3:
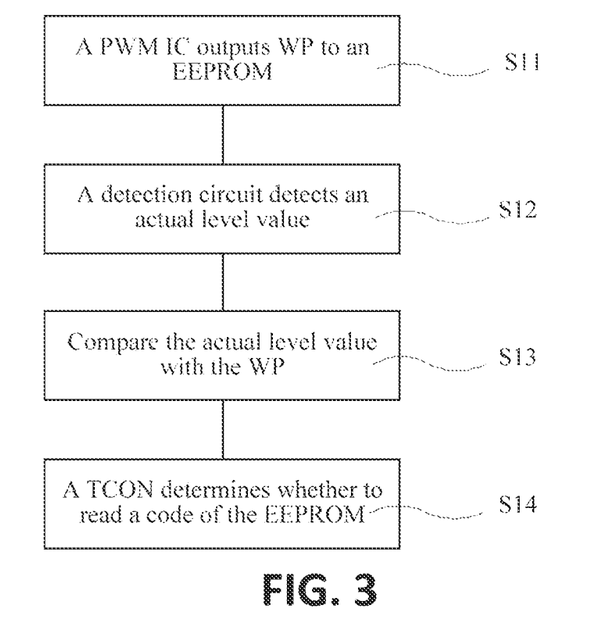
FIG. 3 is a schematic diagram of steps of a method for controlling a timing controller chip according to an embodiment of this application.
Figure 4:
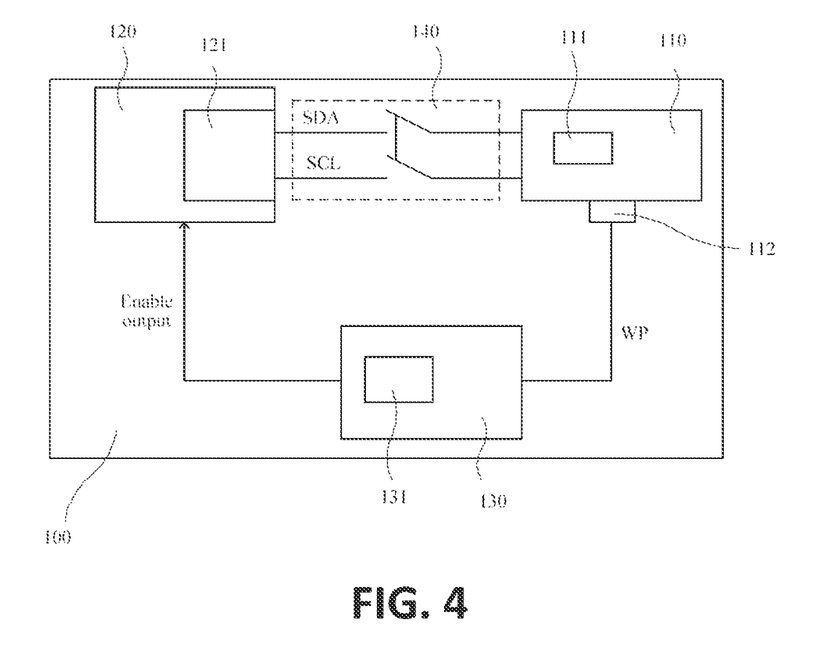
FIG. 4 is a schematic diagram of a display panel according to an embodiment of this application.

The WP level detection circuit 131 added inside the PWM IC sends an enable signal output to the TCON after detecting the magnitude of the WP level to make a decision of connecting or disconnecting the bus, thereby preventing the EEPROM from generating a code reading error. Specifically, after power-on, when the WP level detection circuit 131 detects that the WP (write protection) level is maintained at the High 3.3V level, the detection circuit 131 sends an enable signal output1 to the TCON to make a decision of connecting the I2C bus, that is, the EEPROM is always in the write protection state, so no matter how the I2C signal changes, the code reading error does not occur. When the WP level detection circuit 131 detects that the WP level is lower than the High 3.3V level, the detection circuit 131 sends an enable signal output2 to the TCON to make a decision of disconnecting the I2C bus, that is, the write protection of the EEPROM fails, and the TCON does not output an I2C signal, so that the code reading error does not occur. After power-on again, as long as the WP level returns to normal, the TCON still can read the code correctly, thereby correctly displaying pictures.

In one embodiment, the memory chip 110 further includes a detector Ill which stores standard checksum information. The detector 111 detects the actual checksum information stored in the memory chip 110, and outputs initialization configuration code correct information or initialization configuration code error information according to a comparison result of the standard checksum information with the actual checksum information. The timing controller chip 120 controls to disconnect or enable the inter-integrated circuit bus 140 arranged between the memory chip 110 and the timing controller chip 120 according to the initialization configuration code correct information or the initialization configuration code error information.

The detector 111 is added at the memory chip 110, and the detector Ill stores the standard checksum information corresponding to the correct code. Before the code is read, the detector 111 detects the actual checksum information in the code, and compares the same with the standard checksum information. If the comparison result is that the both are inconsistent, a code error signal is output to the PWM IC. The IC controls the level value of the write protection pin 112 to become the preset level value, and the detection circuit outputs a third enable signal when detecting the preset level value. The third enable signal not only helps the timing controller chip 120 to disconnect the I2C bus, but also informs the reason of disconnection that the code data itself is wrong, and needs to be updated to correct code data, such that the timing controller chip 120 can read the normal code and display the same normally.

It should be noted that all the above detection circuits may be ordinary voltage division detection circuits or current detection circuits, and even ordinary potentiometers or current meters that can realize the function of detecting the level of the corresponding pin.

It should be noted that the sequence numbers of steps involved in a specific solution should not be considered as limiting the order of steps as long as the implementation of this solution is not affected. The steps appearing earlier may be executed earlier than, later than, or at the same time as those appearing later. Such implementations shall all be considered as falling within the protection scope of this application as long as this solution can be implemented.

The display panel of this application may be a twisted nematic (TN) panel, an in-plane switching (IPS) panel, or a multi-domain vertical alignment (VA) panel, and may certainly be any other suitable type of panel.

The foregoing contents are detailed descriptions of this application in conjunction with specific optional embodiments, and it should not be considered that the specific implementation of this application is limited to these descriptions. Persons of ordinary skill in the art can further make simple deductions or replacements without departing from the concept of this application, and such deductions or replacements should all be considered as falling within the protection scope of this application.

What is claimed is:

1. A method for controlling a timing controller chip of a display panel, comprising steps of:
    generating a write protection level and outputting the same to a write protection pin of a memory chip by a pulse modulator;
    detecting an actual level value of the write protection pin by a detection circuit;
    comparing the actual level value with the write protection level, and outputting a comparison result by the detection circuit; and
    controlling whether to read an initialization configuration code stored in the memory chip according to the comparison result;

wherein the step of controlling whether to read an initialization configuration code stored in the memory chip according to the comparison result comprises: receiving the comparison result by the timing controller chip; and controlling whether to read an initialization configuration code stored in the memory chip according to the comparison result by the timing controller chip;

wherein the step of controlling whether to read an initialization configuration code stored in the memory chip according to the comparison result by the timing controller chip comprises: outputting a corresponding enable signal to the timing controller chip according to the comparison result by the detection circuit; and controlling whether to read an initialization configuration code stored in the memory chip according to the corresponding enable signal by the timing controller chip.

2. The method for controlling a timing controller chip of a display panel according to claim 1, wherein the step of controlling whether to read an initialization configuration code stored in the memory chip according to the corresponding enable signal by the timing controller chip comprises:

if the comparison result is that the actual level value is not equal to the write protection level, sending a first enable signal to the timing controller chip by the detection circuit:

controlling to disconnect an inter-integrated circuit bus arranged between the timing controller chip and the memory chip according to the first enable signal by the timing controller chip; and skipping outputting an inter-integrated circuit signal to the memory chip by the timing controller chip.

3. The method for controlling a timing controller chip of a display panel according to claim 2, wherein after the step of chip skipping outputting an inter-integrated circuit signal to the memory chip by the timing controller, the method further comprises:

restarting a circuit to power on again;

re-detecting the actual level value of the write protection pin by the detection circuit;

if a comparison result is that the actual level value is equal to the write protection level, sending a second enable signal to the timing controller chip by the detection circuit;

controlling to enable the inter-integrated circuit bus arranged between the timing controller chip and the memory chip according to the second enable signal by the timing controller chip;

outputting an inter-integrated circuit signal to the memory chip, and reading an initialization configuration code stored in the memory chip by the timing controller chip; and performing initialization configuration according to the read initialization configuration code by the timing controller chip.

4. The method for controlling a timing controller chip of a display panel according to claim 1, wherein the step of controlling whether to read an initialization configuration code stored in the memory chip according to the comparison result further comprises:

the step of controlling whether to read an initialization configuration code stored in the memory chip according to the corresponding enable signal by the timing controller chip comprises:

if the comparison result is that the actual level value is not equal to the write protection level, sending a first enable signal to the timing controller chip by the detection circuit:

controlling to disconnect an inter-integrated circuit bus arranged between the timing controller chip and the memory chip according to the first enable signal;

skipping outputting an inter-integrated circuit signal to the memory chip by the timing controller chip;

restarting a circuit to power on again;

re-detecting the actual level value of the write protection pin by the detection circuit;

if the comparison result is that the actual level value is equal to the write protection level, sending a second enable signal to the timing controller chip by the detection circuit;

controlling to enable the inter-integrated circuit bus arranged between the timing controller chip and the memory chip according to the second enable signal by the timing controller chip;

outputting an inter-integrated circuit signal to the memory chip, and reading an initialization configuration code stored in the memory chip by the timing controller chip; and performing initialization configuration according to the read initial configuration code by the timing controller chip.

5. The method for controlling a timing controller chip of a display panel according to claim 1, wherein the step of controlling whether to read an initialization configuration code stored in the memory chip according to the comparison result by the timing controller chip comprises:

if the comparison result is that the actual level value is not equal to the write protection level, sending a first enable signal to the timing controller chip by the detection circuit:

controlling to disconnect an inter-integrated circuit bus arranged between the timing controller chip and the memory chip according to the first enable signal by the timing controller chip;

skipping outputting an inter-integrated circuit signal to the memory chip by the timing controller chip;

restarting a circuit to power on again;

re-detecting the actual level value of the write protection pin by the detection circuit;

if the comparison result is that the actual level value is equal to the write protection level, sending a second enable signal to the timing controller chip by the detection circuit;

controlling to enable the inter-integrated circuit bus arranged between the timing controller chip and the memory chip according to the second enable signal by the timing controller chip;

outputting an inter-integrated circuit signal to the memory chip, and reading an initialization configuration code stored in the memory chip by the timing controller chip; and performing initialization configuration according to the read initialization configuration code by the timing controller chip.

6. The method for controlling a timing controller chip of a display panel according to claim 2, wherein the step of, if the comparison result is that the actual level value is not equal to the write protection level, sending a first enable signal to the timing controller chip by the detection circuit, comprises:

setting a preset level value by the pulse modulator; and if the actual level value is not equal to the write protection level value but equal to the preset level value in the comparison result, sending a third enable signal to the timing controller chip by the detection circuit.

7. The method for controlling a timing controller chip of a display panel according to claim 6, wherein the step of, if the actual level value is not equal to the write protection level value but equal to the preset level value in the comparison result, sending a third enable signal to the timing controller chip by the detection circuit, comprises:
reading actual checksum information from the actually stored initialization configuration code, and comparing the actual checksum information with pre-stored standard checksum information by a detector; and
sending a third enable signal to the timing controller chip according to a comparison result.

8. The method for controlling a timing controller chip of a display panel according to claim 7, wherein the step of sending a third enable signal to the timing controller chip according to a comparison result further comprises:
if the actual checksum information is inconsistent with the standard checksum information, outputting an initialization configuration code error signal to the pulse modulator;
controlling a level value of the write protection pin to become the preset level value by the pulse modulator; and
sending a third enable signal to the timing controller chip when detecting the preset level value by the detection circuit.

9. The method for controlling a timing controller chip of a display panel according to claim 1, wherein the step of controlling whether to read an initialization configuration code of the timing controller chip stored in the memory chip according to the comparison result by the timing controller chip further comprises:
reading actual checksum information from the actually stored initialization configuration code, and comparing the actual checksum information with pre-stored standard checksum information by a detector;
outputting information about the initialization configuration code to the timing controller chip according to the comparison result; and
controlling whether to read an initialization configuration code of the timing controller chip stored in the memory chip according to the comparison result of the detection circuit by the timing controller chip.

10. The method for controlling a timing controller chip of a display panel according to claim 9, wherein the step of outputting information about the initialization configuration code to the timing controller chip according to the comparison result comprises:
outputting correct information or error information about the initialization configuration code to the timing controller chip according to the comparison result;
controlling to disconnect or enable the inter-integrated circuit bus according to the correct information or error information about the initialization configuration code by the timing controller chip; and
if the timing controller chip receives the correct information about the initialization configuration code, controlling whether to read an initialization configuration code of the timing controller chip stored in the memory chip according to the comparison result of the detection circuit by the timing controller chip.

11. A method for controlling a timing controller chip of a display panel, comprising steps of:

generating a write protection level and outputting the same to a write protection pin of a memory chip by a pulse modulator;
detecting an actual level value of the write protection pin by a detection circuit;
comparing the actual level value with the write protection level, and sending a comparison result to the timing controller chip by the detection circuit;
outputting a corresponding enable signal to the timing controller chip according to the comparison result by the detection circuit;
if the comparison result is that the actual level value is not equal to the write protection level, sending a first enable signal to the timing controller chip by the detection circuit;
controlling to disconnect an inter-integrated circuit bus arranged between the timing controller chip and the memory chip according to the first enable signal by the timing controller chip;
skipping outputting an inter-integrated circuit signal to the memory chip by the timing controller chip;
restarting a circuit;
re-detecting the actual level value of the write protection pin by the detection circuit;
if the comparison result is that the actual level value is equal to the write protection level, sending a second enable signal to the timing controller chip by the detection circuit;
controlling to enable the inter-integrated circuit bus arranged between the timing controller chip and the memory chip according to the second enable signal by the timing controller chip;
outputting an inter-integrated circuit signal to the memory chip, and reading an initialization configuration code stored in the memory chip by the timing controller chip; and
performing initialization configuration according to the read initialization configuration code by the timing controller chip.

12. A display panel, comprising:
a memory chip, comprising a write protection pin, and storing an initialization code of a timing controller chip;
the timing controller chip, reading the initialization code of the timing controller chip and performing initialization configuration;
an inter-integrated circuit bus, arranged between the memory chip and the timing controller chip;
a pulse modulator, outputting a write protection level to the write protection level-pin; and
a detection circuit, arranged in the pulse modulator, and configured to detect an actual level value of the write protection pin, compare the actual level value with the write protection level, and control to disconnect or enable the inter-integrated circuit bus arranged between the memory chip and the timing controller chip according to a comparison result.

13. The display panel according to claim 12, wherein the detection circuit outputs a corresponding enable signal to the timing controller chip, the timing controller chip comprises a Microprogrammed Control Unit, and the Microprogrammed Control Unit receives the corresponding enable signal, and controls to disconnect or enable the inter-integrated circuit bus arranged between the memory chip and the timing controller chip according to the enable signal.

14. The display panel according to claim 13, wherein the memory chip further comprises:

a detector, storing standard checksum information, the detector detecting actual checksum information stored in the memory chip and outputting information about the initialization configuration code to the timing controller chip according to a comparison result of the standard checksum information with the actual checksum information; and outputting initialization configuration code correct information or initialization configuration code error information; and the timing controller chip controls to disconnect or enable the inter-integrated circuit bus arranged between the memory chip and the timing controller chip according to the received information about the initialization configuration code.

15. The display panel according to claim 14, wherein the detector outputs initialization configuration code correct information or initialization configuration code error information to the timing controller chip; and the timing controller chip controls to disconnect or enable the inter-integrated circuit bus arranged between the memory chip and the timing controller chip according to the initialization configuration code correct information or the initialization configuration code error information.

16. The display panel according to claim 15, wherein the display panel further comprises a power switch, the power switch controlling connection and disconnection of the display panel.

* * * * *